United States Patent [19]

Ferralli

[11] Patent Number: 4,474,827
[45] Date of Patent: Oct. 2, 1984

[54] ION INDUCED THIN SURFACE COATING

[76] Inventor: Michael W. Ferralli, 10580 E. Lake Rd., North East, Pa. 16428

[21] Appl. No.: 396,430

[22] Filed: Jul. 8, 1982

[51] Int. Cl.³ .............................................. B05D 3/06
[52] U.S. Cl. ...................................................... 427/38
[58] Field of Search ......................... 427/35, 38, 39–41

[56] References Cited

U.S. PATENT DOCUMENTS

| | | | |
|---|---|---|---|
| 3,329,601 | 7/1967 | Mattox | 427/39 X |
| 4,112,137 | 9/1978 | Zega | 427/38 |
| 4,170,662 | 10/1979 | Weiss et al. | 427/38 |
| 4,227,961 | 10/1980 | Takagi | 427/38 X |
| 4,264,642 | 4/1981 | Ferralli | 427/38 |

OTHER PUBLICATIONS

Heavens, O. S., *Thin Film Physics*, London, Methuen & Co. Ltd., 1970, pp. 2–3.
Holland, L., *Vacuum Deposition of Thin Films*, London, Chapman and Hall Ltd., 1966, pp. 2–3, 211, 510–511.
Chopra, K. L., *Thin Film Phenomena*, New York, McGraw-Hill Book Company, 1969, pp. 50–51, 189.
Boenig, H. V., *Plasma Science and Technology*, Ithaca, N.Y., Cornell University Press, 1982, pp. 122, 173, 180, 181, 251, 282, 283.

Primary Examiner—Evan K. Lawrence

[57] ABSTRACT

Thin film coatings comprising hydrocarbon polymers are deposited on and merged into a substrate by causing secondary ionically activated and electric field energized atomic or molecular ionic species including hydrocarbon species to be directed to a substrate in conjunction with an ion beam of primary energetic ions.

6 Claims, 2 Drawing Figures

ION INDUCED THIN SURFACE COATING

FIELD OF INVENTION

This invention relates to anti-corrosion coatings and specifically to the thin film deposition of such coatings induced by energetic ions.

DISCUSSION OF PRIOR ART

Heretofore, anti-corrosion coatings have been utilized on metal, glass, ceramics, wood, fiber, and polymeric surfaces primarily to inhibit or retard the attack of these materials by agents in the environment where the material is to be used. Such coatings have been made of a great variety of materials including polymers, metals, glass, and ceramics. They have been applied in a great many ways including spraying brushing, dipping, roller coating, vapor deposition, diffusion, evaporation, sputtering, and plasma processes. Further, such coatings, regardless of their method of application, function either by preventing the caustic agent or destructive species in the environment from reaching the substrate, or inhibiting the electro-chemical corrosion reaction from proceeding, or both.

The prior art anti-corrosion coatings are not without their problems in function or application, however. Coatings applied by conventional processes such as spraying, brushing, roller coating, and the like can lack in coating film continuity, homogeneity, thickness, and substrate adhesion. Deficiency in any of these properties will cause an often substantial decrease in the degree of corrosion inhibition conferred to the substrate. Coatings applied by diffusion or evaporation will not lack in continuity, but are difficult to apply in that generally the substrates must be heated and/or maintained at relatively high temperatures. Vapor deposition onto heated substrates may cause diffusion of substrate impurities and adversely affect the efficiency of the anti-corrosion mechanism of the coating. Sputtering and plasma processes inherently cannot be directed solely to the substrate to be treated and thus tend to be wasteful.

Additionally, the adhesion imparted by the aforementioned processes is due either to recognized chemical and physical mechanisms or by diffusion and/or chemical absorption of the deposition material onto the substrate. In all cases, the fundamental character of the substrate is unchanged and there will exist a clear demarcation line between the original substrate surface and the coating. Recently a novel method for the deposition of thin film organic coatings by ion implantation has appeared in the prior art. In accordance with this prior art invention, thin film organic coatings of a polymeric nature are deposited by ion beam implantation of ionized particles. More particularly, a flux comprising ions of organic deposition material is accelerated by electrostatic attraction due to an electric potential gradient or by collisional interaction with an energetic beam comprising ions of non-deposition material, ions of organic deposition material, or ions of both organic deposition material and non-deposition material to deposit a thin film of organic deposition material having a polymeric nature in and on a substrate surface. Film deposition is accomplished by ionic implantation of at least a portion of ions of organic deposition material accompanied by polymerization and film growth resulting in surface and sub-surface bonding of deposited organic film material to the substrate. The thin film organic polymeric coatings of this invention are unique in that they appear to be merged into and within the substrate in such a manner that no distinct interface between the substrate species and the coating species is readily discernible. However, this process is inherently slow, difficult to control, and, due to control deficiencies, variable in the induced anti-corrosion properties. In particular, one embodiment of this prior art invention relies on a collisional reaction between an ion beam of deposition or non-deposition material and a vapor of depostion material in order to impart to the vapor sufficient energy to both ionize it and give it sufficient kinetic energy to coimpinge onto and into the substrate with the ion beam. Although it is likely that the aforementioned collisional reaction will induce ionization as claimed, it is only on rare occasions that such a reaction will also impart to the vapor of deposition material sufficient energy to impinge against the substrate. It is further unlikely that such a collisional reaction will direct the ionized vapor selectively toward the substrate so as to coimpinge with the ion beam. The more common event is that the ionized vapor of deposition material will migrate according to the theory of brownian motion and may impinge anywhere within a deposition chamber. Thus the probability that an ion of the deposition material vapor will coimpinge with the ion beam is extremely remote. For the above reasons this prior art invention reveals a process which is extremely slow.

SUMMARY OF THE INVENTION

The present invention provides a novel method for rapidly depositing a thin film which is merged with as well as coated upon the substrate. In this present invention, secondary ionically activated and electric field directed energized atomic or molecular ionic species are directed to a material surface in conjunction with a beam of primary energetic ions to activate the material surface and merge and bond to said surface the aforementioned ionically activated and electric field energized atomic or molecular ionic species, said species bonding and/or merging occuring in a rapid manner due to the energy and direction induced by the electric field, and adhesion of the species to the substrate being vastly improved due to the surface activation caused by the primary energetic ion beam and the electric field energized atomic or molecular ionic species.

In an embodiment of the invention, a beam of ions which have been energized by means of their acceleration through a potential difference of from 1 to 300 kilovolts is allowed to enter a deposition chamber containing both a gas or vapor of atoms of molecules of deposition material and an electric field directed toward the substrate to be treated. This ion beam, called the primary energetic ion beam, interacts with the contained gas or vapor creating, at least in part, electron-ion pairs. These electron-ion pairs may gain some kinetic energy from such interaction and in consequence may be directed along any path dictated by the principles of particle scattering and, to the extent that such energy transfer is minimal, the pairs will be governed by the theory of brownian motion. However, owing to the existence of the electric field and its direction toward the substrate to be treated, the positive ion species of the pair will be accelerated and directed to the substrate while the electrons of the pair will be directed away from the substrate. The positive ion species, called the secondary ions, will arrive along with the ions of the primary energetic ion beam and the melange of ions will be coimpinged against the substrate. Due to the on or near surface interaction of the primary energetic ion beam, the secondary ions, and the backward traveling electrons (originating from the electron-ion pairs and secondary electron emission from the substrate), the secondary ions and the primary ions will merge with, as well as coat the substrate. The coating will not be clearly differentiable from the original surface but, rather, will have merged with it. The net result of the aforementioned surface interactions, depending on the choice of primary and secondary ion sources, will be that the coating so deposited will be highly adherent, corrosion resistant, and will have properties in sharp contrast to those of the original surface. Because of the presence of the electric field, which is shaped and directed so as to terminate at, near, or beyond the substrate surface, the rapidity of the process is greatly increased. It is to be understood that, while the gas or vapor present in the deposition chamber is composed at least in part of deposition material, the primary energetic ion beam may or may not be composed of deposition material. In those cases where the primary energetic ion beam is not composed of deposition material, the role of said beam is to interact with and activate both the deposition gas or vapor in the deposition chamber and the surface of the substrate to be treated.

Therefore, it is an object of this invention to provide a process for rapidly coating an object with a film which is merged into as well as adherent onto the surface of said object.

It is another object of this invention to provide a process for coating an object with a film such that no clear line of demarcation exists between said film and the object surface owing to the merging of the film with the object surface and, due to said merging, greatly improved corrosion properties being induced.

It is another object of this invention to provide a process whereby the interaction of a primary energetic ion beam, a population of secondary ions of deposition material, the electric field directed toward the object surface, and the backward traveling electrons, produce a coating which is highly adherent and corrosion resistant.

Further objects of this invention will become apparent from a consideration of the drawings and ensuing description thereof.

DESCRIPTION OF THE DRAWINGS

The invention will be fully understood from the following detailed description in combination with the accompanying drawings in which.

DETAILED DESCRIPTION OF THE INVENTION

Figure 1:
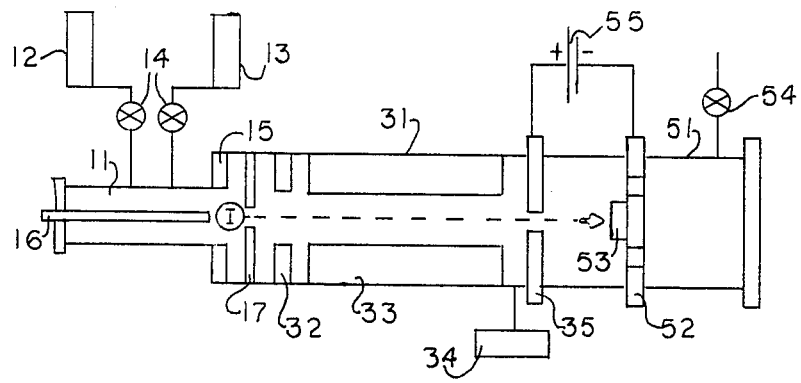
FIG. 1 is a diagrammatic illustration of a deposition system suitable for use in the practice of the invention.

Referring to FIG. 1, there is shown a deposition system 1 for treating surfaces of substrate materials by ion beam induction. In particular, deposition system 1 comprises in combination, an ion source chamber 11, an accelerator section 31 and a deposition chamber or gas cell 51. Ion source chamber 11 includes a source 12 of ionizable deposition material, non-deposition material, or a combination of both, which can be provided in vapor form to chamber 11 through flow control means 14. Chamber 11 can be provided with one or more source(s) 13 of ionizable material which can be provided also in vapor form, to chamber 11 through flow control means 14. Chamber 11 also includes an ionizing means (not shown) for ionizing vaporized ionizable material from either of sources 12 and 13, concentrating solenoid 15, and extraction electrode 16. Ionized material which is extracted from chamber 11 is passed through exit canal 17 into accelerator section 31, which comprises focusing means 32, accelerator means 33, vacuum means 34, and exit canal 35 through which the ionized material from chamber 11, which has been formed into an energetic primary beam of ions in accelerator section 31, is directed into deposition chamber 51. Deposition chamber 51 includes a substrate holder 52, attached to the inner wall of chamber 51 by means not shown, which is centrally positioned in line of sight of substrate 53, and a source, not shown, of deposition material, which can be provided in vapor form through flow control means 54 into chamber 51. It is also provided that exit canal 35 is electrically insulated from both substrate holder 52 and substrate 53 so that exit canal 35 may be positively charged with respect to either substrate 53, substrate holder 52, or both, and all of which may be negatively charged. The charge difference between the exit canal 35 and substrate 53, substrate holder 52, or both, is maintained by potential difference means 55. Positively charging the exit canal 35 while negatively charging the substrate holder 52, substrate 53, or both, is but one embodiment of maintaining an electric field in deposition chamber 51 directed towards the substrate 53.

In operation, an ionizable material in vapor form from either or both of sources 12 and 13 is introduced into ion source chamber 11, through flow control devices 14, which can be a palladium leak valve (for hydrogen or its isotopes), a thermomechanical or piezoelectric leak valve, remote driven fine flow needle valve, or other known type of flow regulating device. Neutral atoms or molecules of the ionizable material are ionized in chamber 11. Ionization can be accomplished by any known technique, such as by electron bombardment from electrons emitted from a heated element, field emission, or radio frequency stimulated ionization, with the latter being currently preferred.

Ionization in chamber 11 creates a flux or plasma containing a melange of electrons, positive ions, negative ions, and neutral fragments, such as free radicals. The melange is concentrated at the exit end of chamber 11 by means of solenoid 15 and the ions of the desired polarity (almost always positive) are extracted by high voltage extraction electrode 16 and forced through exit canal 17, formed of erosion resistant material and directed through focusing system 32, a conventional focusing means such as an Einzel focusing lens, which forms the extracted ions into a coherent ion beam I. Beam I, called the primary energetic ion beam, is energized by acceleration through accelerator section 31 by accelerator means 33, where the beam gains kinetic energy. Accelerator means 33 consists of a series of accelerating electrodes connected by a series of high voltage resistors. The resistors provide a continuous sequence of potential drops from the high voltage input terminal to ground potential at the exit of the accelerator section 31. The acceleration means 33 must provide an acceleration so as to provide the kinetic energy to the ions populating the ion beam exiting chamber 11 of at least 1000 electron volts (1 Kev), and preferably between 25 and 400 Kev.

The accelerated primary energetic ion beam exits accelerator section 31 and is directed into deposition chamber 51 through exit canal 35, and impinges upon the substrate 53 which is located on a holder 52 secured to the inner wall of chamber 51. Chamber 51 is filled with vaporized deposition material and contains the electric field directed towards the substrate 53. The deposition material is ionized by interaction with the primary energetic ion beam and these secondary ions, being energized and directed by the electric field contained in deposition chamber 51 are coimpinged against the substrate for a time sufficient to implant at least a portion of the secondary ions of deposition material into the substrate and to deposit a film which is merged into and with the substrate.

Particles which tend to interfere with control and acceleration of the primary energetic ion beam are removed from the deposition system by vacuum means 34, which is capable of maintaining an operating vacuum of at least $5 \times 10^{-5}$ torr. Accelerating the primary energetic ion beam in a high vacuum reduces energy losses, ion scattering, loss of focusing, and other undesirable factors which preclude or inhibit the formation of the primary energetic ion beam.

Figure 2:
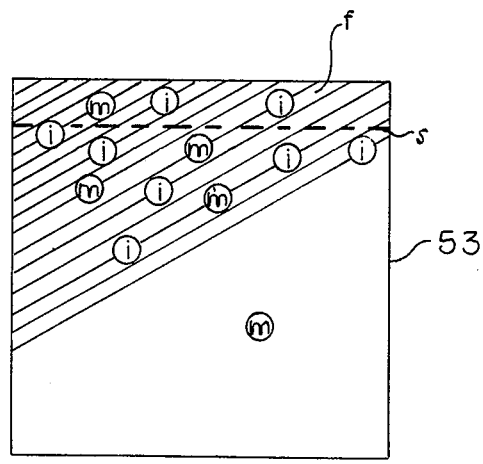
FIG. 2 is a pictorial representation of a substrate treated in accordance with the present invention.

In FIG. 2 there is shown the coalesced film f which is merged into and with substrate 53, substrate atoms m and implanted ions i. The ions which populate the primary energetic ion beam I are provided with a large kinetic energy due to their acceleration by the the electric field of acceleration means 33. The kinetic energy possessed by the primary energetic ion beam serves three primary purposes: (1), ionization of vaporized deposition material, inert gas, or mixture of deposition material and inert gas which may be present in deposition chamber 51; (2) to inject or implant at least a portion of primary energetic beam ions into the substrate material; (3), activate the surface of substrate 53. The energy transferred as a result of the primary energetic ion beam interaction with the vaporized deposition material is sufficient to ionize at least a portion of the vaporized deposition material traversed by said beam. The electric field contained in deposition chamber 51 provides the newly generated secondary ions with direction and energy sufficient to cause the implantation of at least a portion thereof into that portion of the substrate material which is also impinged upon by the primary energetic ion beam. The ionic impingement not only results in the implantation of at least a portion of the total population which is present within the deposition chamber 51 into the substrate material but also in sputtering and resultant cleaning of the surface of the substrate; and, simultaneously with these two processes, the deposition, coalescence and merging of the film with the atoms m of the substrate and the implanted ions i, with the original surface s becoming essentially indefinite, that is, not clearly defined.

In one embodiment of the invention employing an apparatus similar to that shown in FIG. 1, a thin polymeric film is coalesced onto and merged into and with a variety of substrates including steel, aluminum, silver, glass, and silicone elastomer by ionizing non-film forming gaseous species, including argon, neon, helium, and hydrogen in chamber 11, employing radio frequency excitation to form a plasma comprising a flux of ions of such gaseous species. The ions are collimated into a coherent beam and accelerated to an energy level of at least 1 Kev, preferably at least 25 Kev and the beam is passed into deposition chamber 51 which contains vaporized 1,3 butadiene monomer. As the primary energetic ion beam passes through the hydrocarbon atmosphere, a portion of the kinetic energy of said beam is transferred to the neutral hydrocarbon molecules to ionize the hydrocarbon. The electric field contained in the deposition chamber 51, being of the order of 20 volts/cm, provides the resulting secondary ions with sufficient kinetic energy to coimpinge with the primary energetic ion beam I onto the substrate, with the simultaneous ion implantation and film growth processes occuring at the surface of and within the substrate. Thin films of polymer are deposited by employing a deposition material comprising at least one vaporized hydrocarbon monomer, such as ethylene, in chamber 51. Polymer films are also deposited when a monomer such as ethylene is employed in chamber 11 while 1,3 butadiene is contained in chamber 51 along with an electric field of the order of 20 volts/cm, directed toward the substrate. The deposited polymer films may comprise a polymer of a saturated hydrocarbon having at least one carbon atom or a polymer of an unsaturated hydrocarbon having at least two carbon atoms. It is to be noted that, in all cases, the inclusion of the electric field directed toward the substrate increases the speed of film formation by a factor observed to be of the order of 100, and further, the inclusion of said field appears to enhance the adhesion and corrosion properties of the deposited film. In these embodiments, the same or different monomers are optionally present in chamber 51, as can be other species such as oxygen, hydrogen, or bromine along with the monomer. In such cases, the film deposited appears to be doped with the added species.

While the invention has been described with reference to a particular embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for the deposition of thin film comprising:
    (a) ionizing at least one vaporized non-deposition material to form a flux comprising ions and neutral fragments of such vaporized non-deposition material;
    (b) extracting from said flux a primary energetic ion beam consisting essentially of ions of vaporized non-deposition material;
    (c) accelerating said primary energetic ion beam of vaporized non-deposition material to an energy level of at least 1 Kev and directing said primary energetic ion beam into a deposition chamber containing a substrate selected from the group consisting of metals, glass, and polymers, said deposition chamber containing also a vaporized deposition material comprising at least one hydrocarbon monomer and an electric field directed toward said substrate;

(d) passing said primary energetic ion beam of non-deposition material through said vaporized deposition material whereby such vaporized deposition material is ionized by interaction with said primary energetic ion beam of non-deposition material, said ions of vaporized deposition material being secondary ions which, under the influence of the aforementioned electric field, are energized and directed toward the surface of said substrate; and (e) coimpinging said primary energetic ion beam of non-deposition material and secondary ions of vaporized deposition material against a surface of said substrate for a time sufficient to implant at least a portion of said ions of vaporized deposition material into said substrate and to form a thin film comprising a hydrocarbon polymer in and on such substrate, such film being merged into and with ions of vaporized deposition material and the atoms of said substrate.

2. A method according to claim 1 wherein said deposited film comprises a polymer of a saturated hydrocarbon having at least one carbon atom.

3. A method according to claim 1 wherein said deposited film comprises a polymer of an unsaturated hydrocarbon having at least two carbon atoms.

4. A method for the deposition of thin film comprising:

(a) ionizing at least one vaporized deposition material to form a flux comprising ions and neutral fragments of such vaporized deposition material;

(b) extracting from said flux a primary energetic ion beam consisting essentially of ions of vaporized deposition material;

(c) accelerating said primary energetic ion beam of vaporized deposition material to an energy level of at least 1 Kev and directing said primary energetic ion beam into a deposition chamber containing a substrate selected from the group consisting of metals, glass, and polymers, said deposition chamber containing also a vaporized deposition material comprising at least one hydrocarbon monomer and an electric field directed toward said substrate;

(d) passing said primary energetic ion beam of deposition material through said vaporized deposition material whereby such vaporized deposition material is ionized by interaction with said primary energetic ion beam of deposition material, said ions of this vaporized deposition material being secondary ions which, under the influence of the aforementioned electric field, are energized and directed toward a surface of said substrate; and (e) coimpinging said primary energetic ion beam of deposition material and secondary ions of vaporized deposition material against a surface of said substrate for a time sufficient to implant at least a portion of any ions of deposition material whether from the primary energetic ion beam of deposition material or from the secondary ions of vaporized deposition material into said substrate and to form a thin film comprising a hydrocarbon polymer in and on such substrate, such film being merged into and with ions of vaporized deposition material and the atoms of said substrate.

5. A method according to claim 1 wherein said deposited film comprises a polymer of a saturated hydrocarbon having at least one carbon atom.

6. A method according to claim 4 wherein said deposited film comprises a polymer of an unsaturated hydrocarbon having at least two carbon atoms.

* * * * *